(12) United States Patent
Dasgupta et al.

(10) Patent No.: US 11,245,053 B2
(45) Date of Patent: Feb. 8, 2022

(54) MICRO-LED STRUCTURES FOR FULL COLOR DISPLAYS AND METHODS OF MANUFACTURING THE SAME

(71) Applicant: Intel Corporation, Santa Clara, CA (US)

(72) Inventors: Sansaptak Dasgupta, Portland, OR (US); Khaled Ahmed, Anaheim, CA (US); Anup Pancholi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 119 days.

(21) Appl. No.: 16/727,513

(22) Filed: Dec. 26, 2019

(65) Prior Publication Data

US 2020/0135970 A1    Apr. 30, 2020

(51) Int. Cl.
| | | |
|---|---|---|
| *H01L 33/06* | (2010.01) | |
| *H01L 33/20* | (2010.01) | |
| *H01L 33/00* | (2010.01) | |
| *H01L 33/32* | (2010.01) | |
| *H01L 25/075* | (2006.01) | |

(52) U.S. Cl.
CPC .......... *H01L 33/06* (2013.01); *H01L 25/0753* (2013.01); *H01L 33/007* (2013.01); *H01L 33/0093* (2020.05); *H01L 33/20* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 10,431,717 B1 * | 10/2019 | Dasgupta | H01L 33/20 |
| 2014/0097401 A1 * | 4/2014 | Robin | H01L 33/06 257/13 |
| 2020/0105744 A1 * | 4/2020 | Dasgupta | H01L 29/66553 |

OTHER PUBLICATIONS

Bulashevich et al., "Simulation of light-emitting diodes for new physics understanding and device design", Proceedings of SPIE, vol. 8278, Feb. 6, 2012 (13 pages).

* cited by examiner

*Primary Examiner* — Bradley Smith
(74) *Attorney, Agent, or Firm* — Hanley, Flight & Zimmerman, LLC

(57) ABSTRACT

Micro-LED structures for full color displays and methods of manufacturing the same are disclosed. An apparatus for a micro-LED display includes a first portion of a nanorod and a second portion of the nanorod. The first and second portions including gallium and nitrogen. The apparatus includes a polarization inversion layer between the first portion and the second portion. The apparatus includes a cap at an end of the nanorod. The cap including a core and an active layer. The core including gallium and nitrogen. The active layer including indium.

30 Claims, 7 Drawing Sheets

MICRO-LED STRUCTURES FOR FULL COLOR DISPLAYS AND METHODS OF MANUFACTURING THE SAME

FIELD OF THE DISCLOSURE

This disclosure relates generally to micro-LEDs, and, more particularly, to micro-LED structures for full color displays and methods of manufacturing the same.

BACKGROUND

In recent years, micro-LED (micro-light emitting diode) display technology has been the focus of considerable research and development. Among other advantages, micro-LED displays show promise of consuming three to five times less power than OLED (organic LED) displays.

Figure 1:
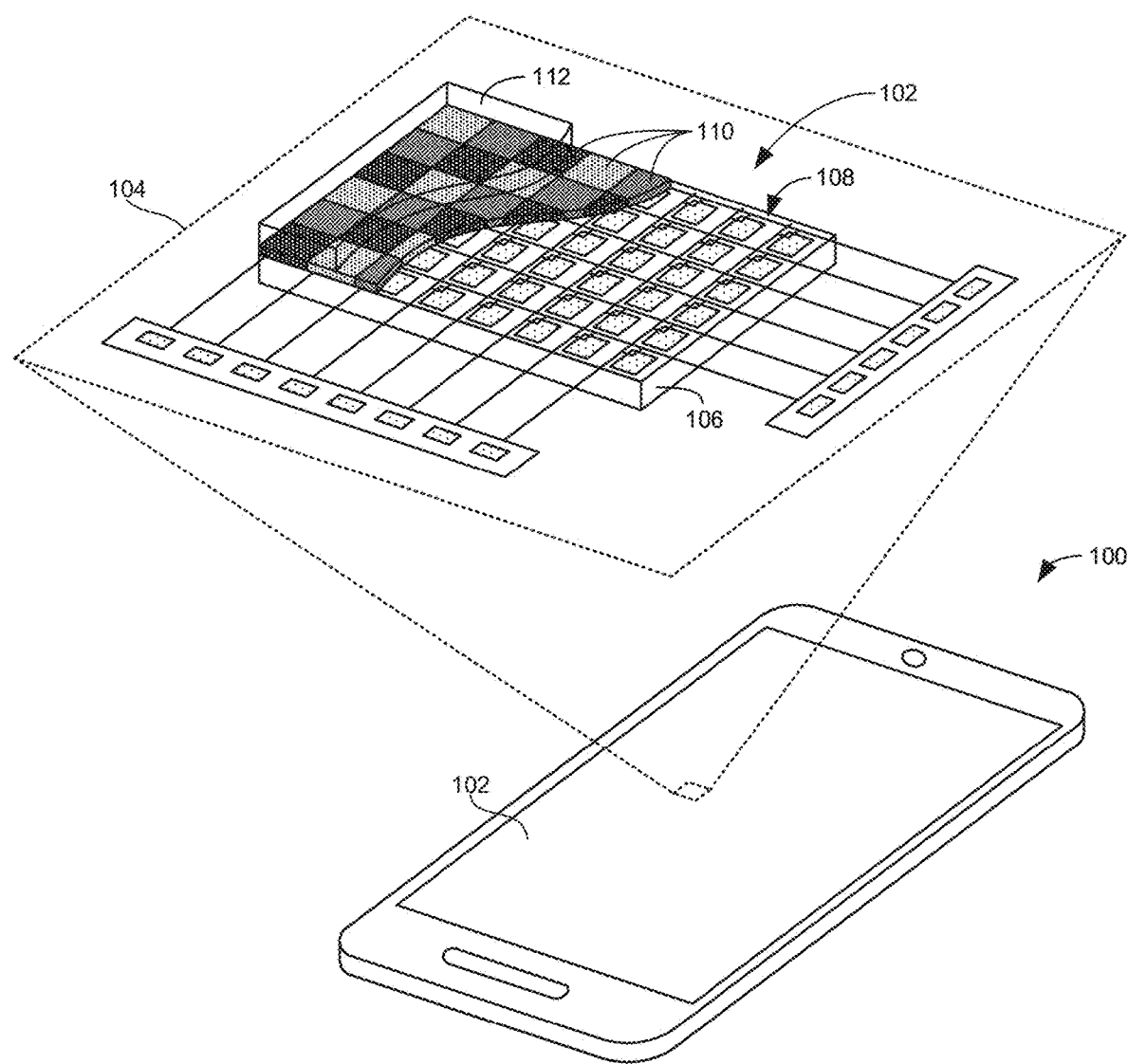
FIG. 1 illustrates an example electronic device with a micro-LED display constructed in accordance with teachings disclosed herein.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Stating that any part is in "contact" with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

As used herein, the term "above" is used with reference to a bulk region of a base semiconductor substrate (e.g., a semiconductor wafer) on which components of an integrated circuit and/or other semiconductor devices are formed. Specifically, as used herein, a first component of an integrated circuit is "above" a second component when the first component is farther away from the bulk region of the semiconductor substrate. Likewise, as used herein, a first component is "below" another component when the first component is closer to the bulk region of the semiconductor substrate. As noted above, one component can be above or below another with other components therebetween or while being in direct contact with one another.

DETAILED DESCRIPTION

For light emitting diodes (LEDs), the emission wavelength is determined by the band gap of the active region of the LED together with the thickness determined confinement effects. Often, the active region of an LED includes one or more quantum wells. For III-nitride based LED devices, such as gallium nitride (GaN) based devices, the active region (e.g., the quantum well(s)) material is preferably ternary, such as $In_xGa_{1-x}N$, where $0 \le x \le 1$. The band gap of such III-nitride devices is dependent on the amount of indium (In) incorporated in the active region (e.g., in the quantum well(s)). The incorporation of a higher indium concentration will yield a smaller band gap corresponding to longer wavelengths of the emitted light.

Indium gallium nitride (InGaN) is an attractive material for the development of various optical devices in the entire visible spectral range owing to the ability to control the bandgap energy by adjusting the amount of indium content. Testing has shown that InGaN-based planar blue LEDs with relatively low levels of indium exhibit an internal quantum efficiency (IQE) of approximately 83%. However, the IQE significantly decreases as the wavelength of emitted light increases (associated with increasing levels of indium). For instance, the IQE for planar green light LEDs is less than about 50% and the IQE for planar red light LEDs is below 10%. Thus, while relatively efficient blue and reasonably efficient green micro-LEDs can be manufactured using nanowire LED technology based on a gallium nitride (GaN) material system, it has been challenging to obtain high efficiency red micro-LEDs using the GaN material system.

There are at least two factors that cause low efficiency in InGaN-based LEDs with relatively high indium content (e.g., red LEDs). First, inefficiencies result from defects in the InGaN active layer due to a lattice mismatch between $In_xGa_{1-x}N$ active layer and the underlying GaN structural core (e.g., the lattice mismatch between InN and GaN is 11%). Secondly, the piezoelectric field in the strained InGaN active layers (quantum wells) becomes very large for high indium content. The piezoelectric field causes low internal quantum efficiency due to electron-hole separation in the InGaN multiple quantum wells. The electron-hole separation is particularly important for growing InGaN on c-plane surfaces of the GaN crystal structure. By contrast, this effect is negligible for InGaN on a-plane and m-plane surfaces of the GaN crystal structure.

Full color LED displays require LEDs that emit red, green, and blue light. While GaN-based LEDs may produce blue light relatively efficiently, the efficiency of LEDs significantly decreases for longer wavelengths (green to some extent and much more so for red) due to the enlarged internal electric field and poor crystal quality associated with the quantum wells including relatively high indium content. These problems for micro-LEDs are at least partially mitigated through the use of three-dimensional nanostructures. Generally, three-dimensional structures can increase light extraction efficiency, enlarge the emitting surface area of the LEDs, and relax the strain. A number of different three-dimensional structures have been developed, such as nanowires and nanopyramids, with varying degrees of success in increasing the efficiency of red light emissions. For instance, axial nanowire structures for micro-LEDs can incorporate relative high concentrations of indium (e.g., up to around 45%) to provide relatively efficient red light emissions. However, such nanowire structures require molecular beam epitaxy to grow, which is not scalable to large (e.g., 300 mm) wafer sizes. As a result, manufacturing displays using axial nanowire structures is not an economically viable option.

An advantage of hexagonal pyramids is that such structures are naturally grown by the low surface energy of the semipolar facets. As a result, it is relatively easy to obtain highly crystalline, highly faceted structures. Furthermore, semipolar facets are able to incorporate relatively large amounts of indium. Nanopyramids with InGaN quantum wells have been successfully used to produce relatively efficient blue and green micro-LEDs. However, known nanopyramid structures and manufacturing techniques are still limited in the amount of indium that can be incorporated therein. As a result, manufacturing relatively efficient red micro-LEDs remains a challenge. Reasonably efficient red light emissions have been achieved using nanopyramids with InGaN/GaN double heterostructures that enable higher amounts of indium. However, the emission spectrum of red light from such micro-LEDs was twice as wide as desired (e.g., a full width half maximum (FWHM) value of about 120 nm versus a desired value less than or equal to 60 nm). This relatively wide spectral width is the result of nonuniform indium composition along the side of the nanopyramid, with a relatively high indium composition (e.g. 45%) observed at the tip of the pyramid with lower compositions (e.g. 35%) observed at the base of the pyramid. For relatively efficient red light emissions, the InGaN active layer needs to have an indium composition of at least 40%, with higher amounts of indium increasing the efficiency. The nonuniform concentration of indium on the pyramid facets negatively affects the color purity and color gamut of the associated display.

Another challenge with existing approaches to manufacturing nanopyramid structures for micro-LEDs is that such structures are limited to formation on sapphire wafer substrates, which is cost prohibitive for micro-LED display production. Further, existing approaches involve the formation of a relatively thick GaN buffer, which are not suitable for scaling to 300 mm silicon wafers.

Examples disclosed herein describe micro-LED displays that can incorporate large (e.g., greater than 45%, greater than 50%, greater than 55%) concentrations of indium in a uniform manner for efficient red light emissions (e.g., an internal quantum efficiency of at least 15% and possibly much higher (e.g., 25%, 40%, 50%)) with a relatively narrow emissions spectrum (e.g., a FWHM less than 70 nm or even less (e.g., less than 60 nm, less than 45 nm)) for improved color purity and color gamut. Furthermore, examples disclosed herein may be monolithically manufactured on large (e.g., 300 mm) silicon wafers alongside blue and green micro-LEDs, thereby substantially reducing manufacturing costs. The general structure of example micro-LEDs described herein involves a nanopyramid with the exposed facets corresponding to r-planes of the crystal structure. In some examples, the structure may be a truncated pyramid with r-planes surrounding a c-plane at the top of the pyramid (rather than the r-planes converging to a peak).

Unlike existing nanopyramids used for micro-LEDs that typically include Ga-polar GaN pyramid cores, some example micro-LEDs disclosed herein include N-polar GaN pyramid cores. As used herein, a Ga-polar GaN nanopyramid structure is a GaN pyramid structure with gallium bonds exposed on outer surfaces or facets of the pyramid as it is grown. By contrast, a N-polar GaN nanopyramid structure is a GaN pyramid structure with nitrogen bonds exposed on outer surfaces or facets of the pyramid as it is grown. N-polar GaN nanopyramid structures are used in some examples because such structures are capable of incorporated higher amounts of indium in the active layer (e.g., the quantum well(s)) to enable more efficient emissions of longer wavelengths of light (e.g., green and particular red). Furthermore, N-polar surfaces on a GaN nanopyramid enables the growth of InN based layers (e.g., without Ga) for even more efficient red light emissions. In some examples, N-polar pyramid structures for red micro-LEDs are integrated on a single wafer with blue and green micro-LEDs manufactured from Ga-polar pyramid structures. In other examples, N-polar pyramid structures may be monolithic manufactured for all three of the red, green, and blue pixels of a micro-LED display. Furthermore, in some examples, N-polar surfaces with high concentrations of indium enable the efficient emission of infrared and/or near-infrared light, thereby enabling the incorporation of infrared micro-LEDs alongside full color (e.g., red, green, and blue) micro-LEDs on the same silicon wafer. In some examples, the infrared micro-LEDs may be used as sensors to detect objects in proximity to a display including such micro-LEDs. Accordingly, in some examples, infrared micro-LEDs may enable a touch sensitive display based on sensors that are manufactured at the same time and one the same silicon wafer as color micro-LEDs for the display.

Another challenge in the construction of micro-LED displays arises from the need to transfer micro-LEDs formed on a silicon wafer to a separate backplane substrate containing circuitry to activate and/or control the micro-LEDs. To enable this transfer, the micro-LEDs need to be separated from the silicon wafer substrate on which the micro-LEDs are initially formed. This separation is typically accomplished by forming a release layer on the silicon wafer before the nanostructures for the micro-LEDs are formed. Once the micro-LEDs are formed on a silicon wafer (with a release layer deposited therebetween), the stack is inverted and pressed against a backplane substrate to electrically connect the micro-LEDs to metal leads on the backplane substrate. Thereafter, an ablation process is implemented during which an infrared laser is irradiated through the silicon wafer towards the release layer. The release layer reacts to the infrared irradiation by vaporizing or ablating, thereby causing the micro-LEDs to separate from the silicon wafer to complete the transfer to the backplane substrate. While the release layer enables the separation of the micro-LEDs from the underlying silicon wafer on which the micro-LEDs were initially formed, the release layer creates difficulties for the formation of the micro-LEDs. In particular, while nanopyramid structures can be grown on a release layer, they do not grow uniformly across a wafer such that resulting micro-LEDs manufactured using such structures may not be consistent across an entire wafer.

Examples disclosed herein overcome the above challenges presented by a release layer by depositing an additional transition layer above the release layer before the growth of the nanopyramid structure is initiated. By the inclusion of this additional transition layer, example micro-LEDs may be manufactured more uniformly across a wafer while at the same time still providing the release layer to enable transfer of the micro-LEDs to a backplane substrate during subsequent processing.

FIG. 1 illustrates an example electronic device 100 with a micro-LED display 102 constructed in accordance with teachings disclosed herein. The electronic device 100 may be any type of electronic device that includes a display such as a laptop, a tablet, a smartphone, a smartwatch, a television, a computer monitor, etc. The illustrated example of FIG. 1 also includes a partially cutaway close up 104 of a portion of the micro-LED display 102. As shown in the illustrated example, the display 102 includes an underlying substrate 106 that carries a transistor-based pixel driver circuit 108 with a grid of wires used to activate individual pixels (or subpixels) of the display 102. The pixel driver circuit 108 may be implemented using complementary metal-oxide-semiconductor (CMOS) technology and/or thin-film transistor (TFT) technology. In the illustrated example, an array of red, green, and blue micro-LEDs 110 are electrical coupled to the pixel driver circuit 108. As mentioned above, ins some examples, the micro-LEDs 110 of the display 102 may also include infrared micro-LEDs. Each individual micro-LED 110 corresponds to a different pixel (or subpixel) of the display that is driven by the pixel driver circuit 108. On top of the micro-LEDs 110 (opposite the substrate 106 and the pixel driver circuit 108) is a transparent conductive film 112.

FIGS. 2-7 illustrate stages in an example process to manufacture an example micro-LED assembly 200 on a silicon substrate 202 in accordance with teachings disclosed herein. In some examples, the silicon substrate 202 corresponds to a relatively large (e.g., 300 mm) silicon wafer. In the illustrated example, the crystalline structure of the silicon substrate 202 is oriented such that a top surface of the substrate corresponds to Si (111). In some such examples, the Si (111) substrate 202 is offcut at an angle from between 2 degrees and 8 degrees.

Figure 2:
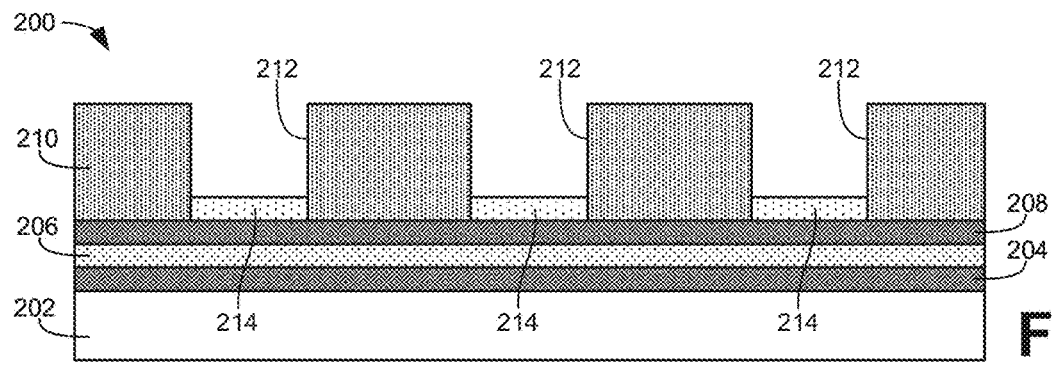
FIGS. 2-7 illustrate stages in an example process to manufacture an example micro-LED assembly on a silicon wafer in accordance with teachings disclosed herein.

FIG. 2 represents the micro-LED assembly 200 after a number of fabrication stages have been accomplished to add different layers of material on to the silicon substrate 202. In particular, as shown in the illustrated example, a first transition layer 204 is deposited on the silicon substrate 202. The first transition layer 204 provides a buffer that enables a smoother transition between the different crystalline structures of the silicon substrate 202 and the material to be subsequently formed above the first transition layer 204 to produce the structures for micro-LEDs. In some example, the first transition layer 204 includes aluminum and nitrogen (e.g., aluminum nitride (AlN)). The first transition layer 204 may have a thickness less than 100 nm (e.g., ranging from about 10 nm to about 50 nm). The first transition layer 204 may be deposited on the silicon substrate 202 through epitaxially growth and/or any other suitable method.

A release layer 206 is formed on top of the first transition layer 204. The release layer 206 enables micro-LEDs subsequently formed above the release layer 206 to be severed or separated from the underlying silicon substrate 202 so that the micro-LEDs can be transferred to a backplane substrate containing circuitry to activate and/or control the micro-LEDs. Further detail regarding this transfer process is provided below in connection with FIGS. 13 and 14. In the example of FIG. 2, the release layer 206 includes a transition metal nitride such as, for example, titanium nitride (TiN), hafnium nitride (HfN), niobium nitride (NbN), tantalum nitride (TaN), Zirconium nitride (ZrN), etc. Additionally or alternatively, in some examples, the release layer 206 includes molybdenum (Mo). The release layer 206 may have a thickness less than 100 nm (e.g., ranging from about 10 nm to about 50 nm). The release layer 206 may be formed on the first transition layer 204 through sputtering deposition (e.g., hot sputtering) and/or any other suitable deposition method to achieve a wurtzite (WZ) crystal structure.

The WZ crystal structure of the release layer 206 may be sufficient to enable the growth of gallium nitride (GaN) that serves as the core material for example micro-LEDs disclosed herein. That is, the release layer 206 may serve as a nucleation layer for the gallium nitride. However, as shown in the illustrated example, a second transition layer 208 is formed on the release layer 206. The second transition layer 208 improves the ability of gallium nitride to grow consistently across the silicon wafer for more consistent micro-LEDs. In some examples, the second transition layer 208 includes the same material as the first transition layer 204 (e.g., aluminum nitride). The second transition layer 208 may have a thickness less than 100 nm (e.g., ranging from about 10 nm to about 50 nm). The second transition layer 208 may be deposited on the release layer 206 through epitaxially growth and/or any other suitable method. In some examples, the second transition layer 208 may be omitted.

In the illustrated example, a mask 210 is formed on the second transition layer 208. The mask 210 may be formed of any suitable dielectric material such as silicon nitride ($Si_3N_4$). The mask 210 may have a thickness of at least 200 nm (e.g., 300 nm, 400 nm, etc.) and may be deposited using atomic layer deposition (ALD), plasma-enhanced chemical vapor deposition (PECVD), and/or any other suitable deposition method. Once formed, the mask 210 undergoes a photolithographic process to create vertical apertures or openings 212 that extend through the thickness of the mask 210 to expose regions of the underlying second transition layer 208. In some examples, the apertures 212 in the mask 210 have a hexagonal profile with a width of around 50 nm. In other examples, the width of the apertures 212 may be larger (e.g., up to about 100 nm) or smaller (e.g., as low as about 25 nm). Thus, the apertures 212 correspond to relatively narrow holes that are significantly deeper than they are wide.

The exposed regions of the second transition layer 208 at the base of the apertures 212 serve as a nucleation layer for growing gallium nitride (GaN) nanorods having a shape defined by shape of the apertures 212. A first portion 214 of a GaN nanorod is shown in FIG. 2 on the second transition layer 208 within each aperture 212. As mentioned above, in some examples, the second transition layer 208 may be omitted with the underlying release layer 206 serving as the nucleation layer. In such examples, the first portion 214 of the GaN nanorods is epitaxially grown from exposed regions of the release layer 206.

Figure 3:
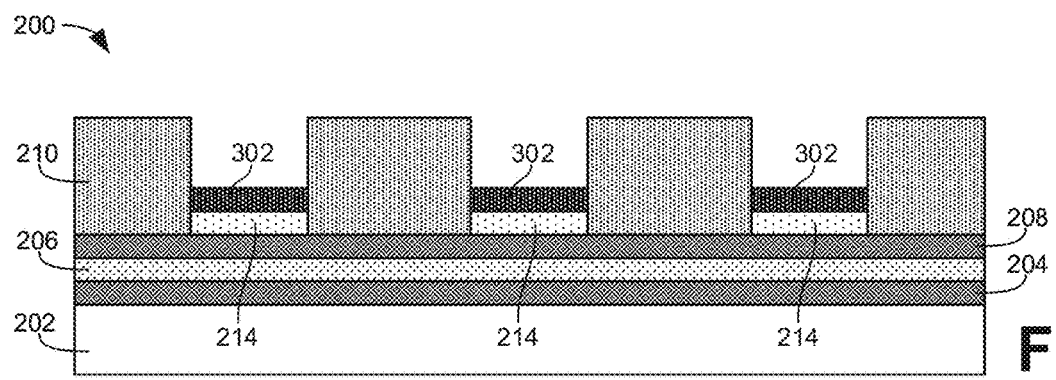
Figure 4:
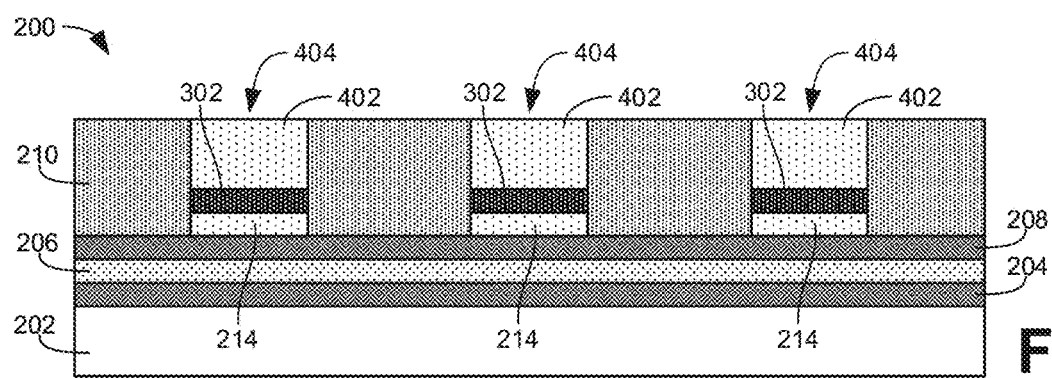

Regardless of whether the GaN nanorods are grown from the release layer 206 or from the second transition layer 208, the first portion 214 is a Ga-polar GaN structure meaning that the exposed upper surface of the first portion 214 as it grows corresponds to gallium. However, N-polar GaN structures are capable of incorporating higher amounts of indium than GaN structures that are Ga-polar. For instance, Ga-polar GaN pyramid structures may contain up to 45% indium whereas N-polar GaN pyramid structures may contain as much as 65%. The higher amounts of indium in the N-polar structures is useful to produce micro-LEDs that emit red light (and other longer wavelengths (e.g., infrared)) more efficiently. Accordingly, in some examples, a polarization inversion layer 302 is formed on the first portion 214 of GaN as represented in FIG. 3. Thereafter, a second portion 402 of GaN is epitaxially grown on the inversion layer 302 to the height of the mask 210 to form complete GaN nanorods 404 as represented in FIG. 4. As mentioned above, the GaN nanorods 404 have a shape defined by the shape of the aperture 212. Thus, in this examples, the nanorods 404 have a relatively narrow and tall hexagonal columnar shape with separate nanorods 404 separated by the dielectric material of the mask 210. The polarization inversion layer 302 within the nanorods 404 is means for inverting the polarity of the second portion 214 of the GaN nanorods 404 above the inversion layer 302 relative to the first portion 214 below the inversion layer 302. That is, the second portion 402 is an N-polar GaN structure meaning that the exposed upper surface of the second portion 402 as it grows corresponds to nitrogen.

In some examples, the thickness of the polarization inversion layer 302 between the first and second portions 214, 402 is relatively thin having a thickness of less than 15 nm (e.g., ranging from about 5 nm to about 10 nm). The polarization inversion layer 302 may be located at any height within the apertures 212 with the thicknesses of the first and second portions 214, 402 varying accordingly. In some examples, the thickness of the first portion 214 is relatively thin (e.g., between about 25 nm and 50 nm) with a majority of the thickness (e.g., height) of the nanorods 404 corresponding to the second portion 402.

In some examples, both the first portion 214 and the second portion 402 of the GaN nanorods are epitaxially grown using a metal organic chemical vapor deposition (MOCVD) process. In some such examples, the polarization inversion layer 302 is deposited in-situ within the MOCVD chamber used to grow both the first and second portions 214, 402 of the nanorods 404. In such examples, the polarization inversion layer 302 may include combinations of one or more of aluminum, oxygen, nitrogen, and magnesium (e.g., aluminum oxide ($AlO_x$), aluminum oxynitride (AlON), and/or magnesium nitride ($Mg_3N_2$)). Additionally or alternatively, in some examples, the polarization inversion layer 302 may be deposited ex-situ. In such examples, the polarization inversion layer 302 may include combinations of one or more of silicon, carbon, aluminum, and oxygen (e.g., silicon carbide (SiC), and/or aluminum oxide ($Al_2O_3$)).

Figure 5:
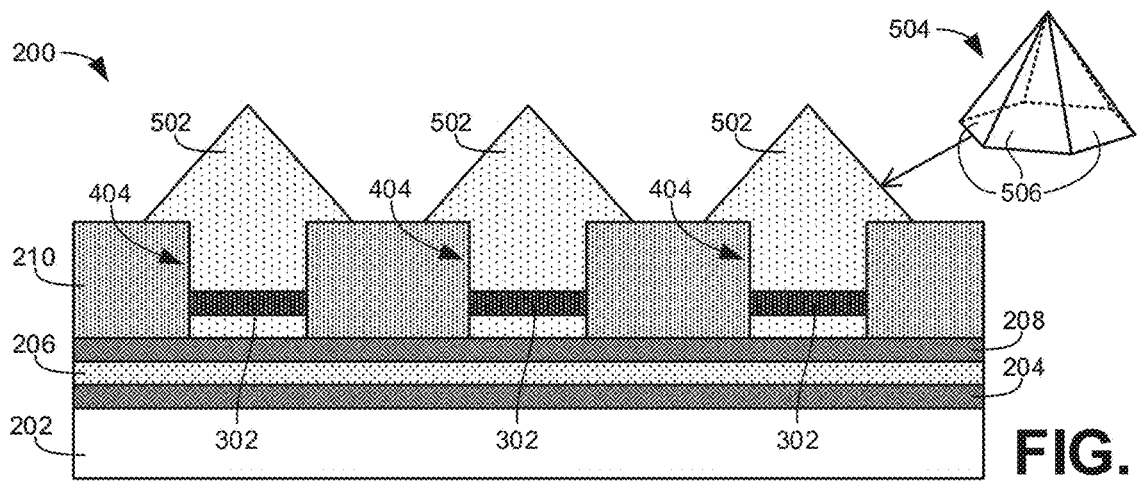

The GaN nanorods 404 formed within the apertures 212 of the mask 210 serve as a seed from which remote nanopyramids 502 above the mask 210 may be epitaxially grown as represented in FIG. 5. The nanopyramids 502 are also referred to herein simply as pyramids for the sake of brevity. The pyramids 502 are referred to as "remote" because of the relatively large (e.g., 300 nm) thickness of the mask 210 resulting in long nanorods 404 relative to their width and the corresponding width of the pyramids 502. In some examples, the pyramids 502 may be grown to a height of at least 500 nm (e.g., about 600 nm). Thus, in some examples, the pyramids may be significantly taller than the thickness of the mask 210 (and corresponding height of the nanorods 404). As represented in the illustrated example of FIG. 5, the pyramids 502 are an extension of the growth of GaN in the nanorods 404. As such, in this example, the pyramids 502 are also N-polar because the polarity was reversed based on the inclusion of the polarization inversion layer 302 within the nanorods 404. In some examples, the GaN in the nanorods 404 and/or the pyramids 502 include a p-type dopant. In some examples, the nanorods 404 are formed using continuous MOCVD epitaxial growth. By contrast, in some examples, the pyramids 502, which extend above the mask 210, are formed using pulsed MOCVD epitaxial growth.

In the illustrated example, the pyramids 502 are hexagonal in shape as shown by the representative isometric diagram 504 of FIG. 5. More particularly, the pyramids 502 include six semipolar $\{1\bar{1}01\}$ planes 506 (corresponding to r-planes of the crystal structure) on which an active layer 602 (FIG. 6) for individual micro-LEDs is formed. The active layer 602 corresponds to a stack of one or more quantum wells formed of materials including indium, gallium, and nitrogen (e.g., indium gallium nitride (InGaN) and/or indium nitride (InN)). An advantage of using hexagonal pyramid structure of the illustrated example is that InGaN quantum wells (within the active layer 602) grown on semipolar $\{1\bar{1}01\}$ planes 506 possess polarization-induced electric fields with magnitudes that are about a factor of ten lower than the induced electric fields in quantum wells of the same composition grown on c-planes of N-polar GaN structures. In some examples, the active layers 602 (including InGaN) are formed using pulsed MOCVD epitaxial growth to control the uniformity and composition of indium. As mentioned above, the composition or concentration of indium in the active layer 602 affects the wavelengths of light produced by the resulting micro-LED. In the illustrated example of FIG. 6, the left most active layer 602 includes the least indium (e.g., a concentration of 20%) to cause the LED to emit blue light. The central active layer 602 in the illustrated example includes an intermediate amount of indium (e.g., a concentration of 30%) to cause the LED to emit green light. The right most active layer 602 in the illustrated example includes the most indium (e.g., a concentration of 40% or more (e.g., 45%, 50%, 55%, 60%, 65%)) to cause the LED to emit red light.

Figure 6:
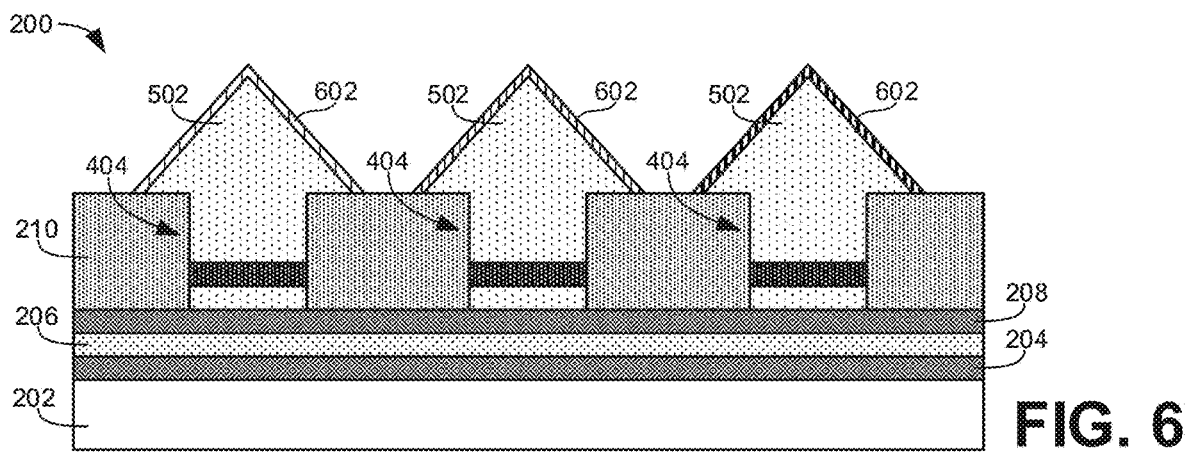
Figure 7:
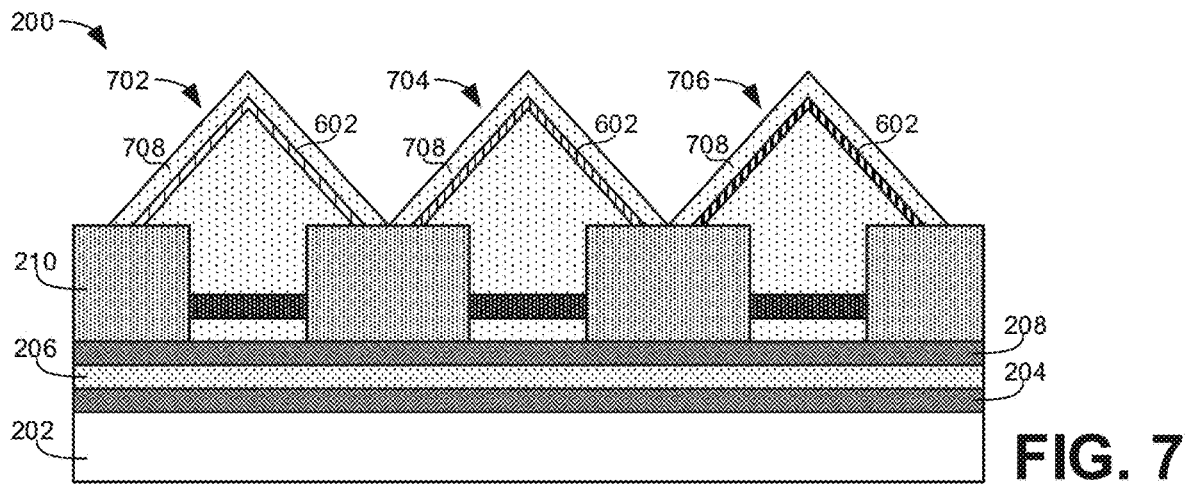

FIG. 7 represents the completed structures for three micro-LEDs 702, 704, 706 while still attached to the silicon substrate 202. In this example, based on the amounts of indium in the active layers 602 for the respective LEDs outlined above, the first micro-LED 702 is to operate as a blue micro-LED, the second micro-LED 704 is to operate as a green micro-LED, and the third micro-LED 706 is to operate as a red micro-LED. As shown in the illustrated example, the micro-LEDs 702, 704, 706 are completed (relative to the stage in the process represented in FIG. 6) by forming a p-cladding layer 708 over the active layer 602. The p-cladding layer 708 may include gallium and nitrogen (e.g., gallium nitride). In some examples, the GaN in the p-cladding layer 708 includes a p-type dopant. In some examples, the p-cladding layer 708 is formed using pulsed MOCVD epitaxial growth. The GaN of the pyramids 502 and the p-cladding layers 708 serve as quantum barriers to the quantum well(s) contained within the active layers 602 of the micro-LEDs 702, 704, 706. The pyramids 502, active layers 602, and p-cladding layers 708 are collectively referred to herein as caps above the nanorods 404.

Figure 8:
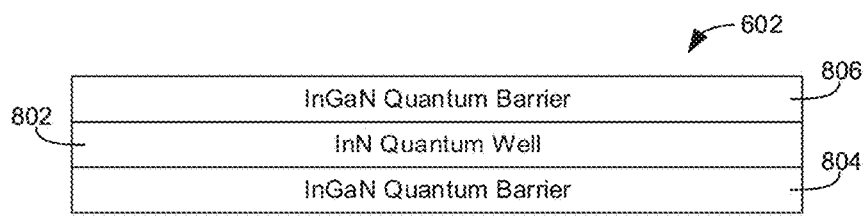
FIG. 8 illustrates an example stack of layers forming a quantum well within the active layer of the micro-LEDs in the example micro-LED assembly of FIG. 7.

As mentioned above, a challenge in achieving efficient red light emissions is the lattice mismatch between the InGaN in the active layer 602 and GaN in the underlying core pyramid 502 (and the p-cladding layer 708). However, inverting the polarity of the GaN (from Ga-polar to N-polar) through the polarization inversion layer 302 enables higher content of indium to be grown on the pyramids 502, which reduces defects resulting from the lattice mismatch. In some examples, the improved lattice structure of the InGaN on the underlying N-polar GaN surface can serve as a transition layer to the formation of a layer of indium nitride (InN). That is, a layer of material that does not include gallium may be formed on a layer of InGaN for even higher concentrations of indium for increased efficiency of emissions of long wavelength light (e.g., red light and/or infrared light). More particular, as shown in the illustrated example of FIG. 8, the active layer 602 includes a quantum well layer 802 that includes indium and nitrogen but no gallium (e.g., a layer of InN) that is sandwiched between two quantum barrier layers 804, 806 that include indium, nitrogen, and gallium (e.g., layers of InGaN). In some examples, the quantum barrier layers 804, 806 have an indium concentration of between 15% and 20% and a thickness of less than 15 nm (e.g., between about 5 nm and 10 nm). In some examples, the quantum well layer 802 has an indium concentration of at least 50% and a thickness of less than 5 nm (e.g., between about 2 nm and 3 nm). In some examples, the quantum well layer 802 does not include gallium. Arranging the active layer 602 with a stack of InGaN and InN, as shown in FIG. 8, enables efficient emissions of even longer wavelength than a quantum well based on InGaN with quantum barriers corresponding to GaN. In some examples, micro-LEDs fabricated in this manner may emit light at wavelengths above 700 nm (e.g., in the infrared range). Thus, in some examples, while the micro-LEDs 702, 704, 706 of FIG. 7 are described as blue, green, and red micro-LEDs, additional infrared or near-infrared micro-LEDs may be fabricated in the same manner on the same silicon substrate 202 (e.g., the same silicon wafer).

In some examples, the bottom quantum barrier layer 804 shown in FIG. 8 is formed on the N-polar GaN surface of an underlying pyramid 502 of FIGS. 5-7. In some examples, the GaN p-cladding layer 708 shown in FIG. 7 is formed on the upper quantum barrier layer 806 of FIG. 8. In some examples, a second InN quantum well layer may be formed on the upper quantum barrier layer 806 followed by another InGaN quantum barrier before the p-cladding layer 708 is deposited. In some examples, a series of InN quantum well layers of any suitable number may be alternately stacked with a corresponding number of InGaN quantum barriers.

Figure 9:
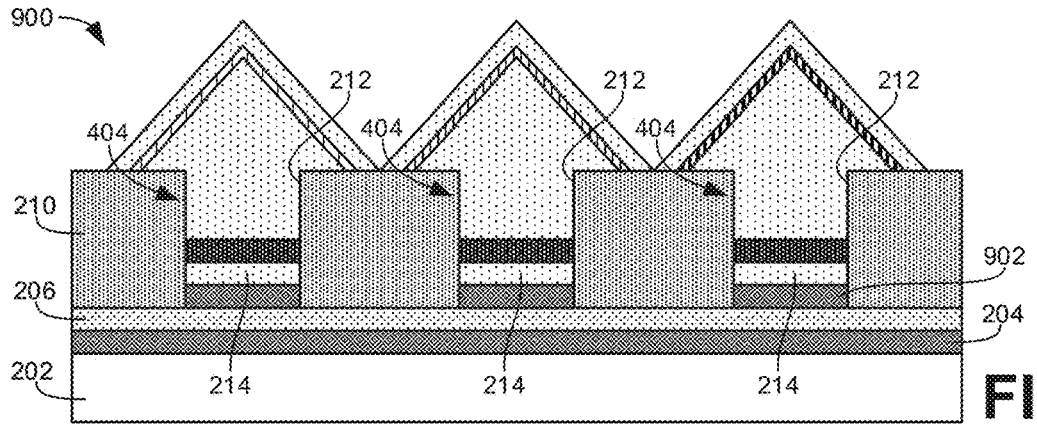
FIG. 9 illustrates another example micro-LED assembly constructed on a silicon wafer in accordance with teachings disclosed herein.

FIG. 9 represents another example micro-LED assembly 900 at the same stage of fabrication as the micro-LED assembly 200 shown in FIG. 7. As shown in the illustrated example of FIG. 9, the micro-LED assembly 900 includes a similar silicon substrate 202, a similar first transition layer 204, and a similar release layer 206 as described above for the micro-LED assembly 200 of FIGS. 2-7. However, unlike the assembly 200 of FIGS. 2-7, the example micro-LED assembly 900 of FIG. 9 includes the mask 210 formed directly on the release layer 206 with similar apertures 212 to those described above in connection with FIG. 2. That is, unlike the example assembly 200 of FIGS. 2-7 that includes a second transition layer 208 between the release layer 206 and the mask 210, in the illustrated example of FIG. 9, a second transition layer 902 is added after the mask 210 has be deposited and the apertures 212 have been formed through photolithography. More particularly, as shown in FIG. 9, the second transition layer 902 is limited to the exposed regions of the release layer 206 at the bottom of the apertures 212. Once the second transition layer 902 has been deposited, the process to complete the micro-LED assembly 900 of FIG. 9 follows the same processes outlined above in connection with FIGS. 2-7.

Figure 10:
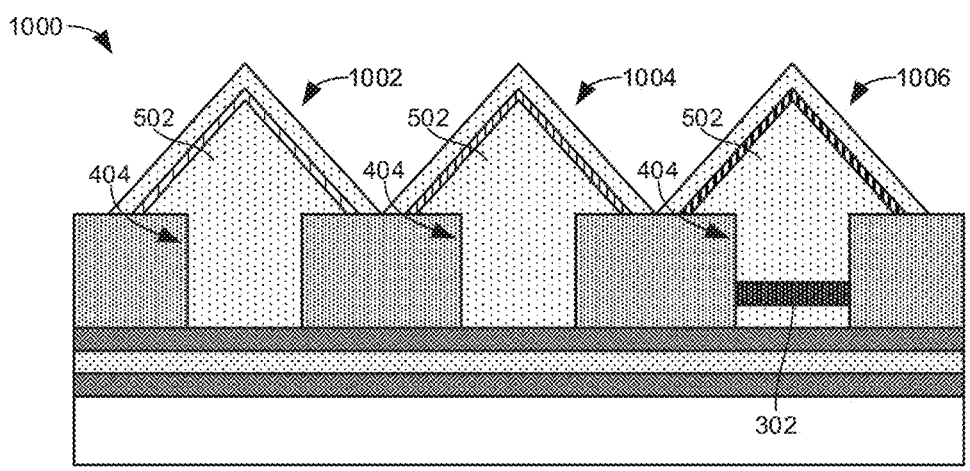
FIG. 10 illustrates another example micro-LED assembly constructed on a silicon wafer in accordance with teachings disclosed herein.

FIG. 10 represents another example micro-LED assembly 1000 at the same stage of fabrication as the micro-LED assembly 200 shown in FIG. 7. As in FIG. 7, the micro-LED assembly 1000 of FIG. 10 includes a blue micro-LED 1002, a green micro-LED 1004, and a red micro-LED 1006. The example micro-LED assembly 1000 of FIG. 10 is substantially the same as the example micro-LED assembly 200 of FIG. 7 except that the nanorods 404 associated with the blue and green micro-LEDs 1002, 1004 do not include the polarization inversion layer 302. That is, in the illustrated example of FIG. 10, only the nanorod 404 associated with the red micro-LED 1006 includes the polarization inversion layer 302. As such, in this example, while the GaN in the pyramid 502 associated with the red micro-LED 1006 is N-polar, the GaN in the pyramids 502 associated with the blue and green micro-LEDs 1002, 1004 is Ga-polar. In some examples, both the green and red micro-LEDs 1004, 1006 are fabricated with N-polar GaN cores (with a polarization inversion layer 302 in the nanorods 404) while only the blue micro-LEDs 1002 have Ga-polar GaN cores.

Figure 11:
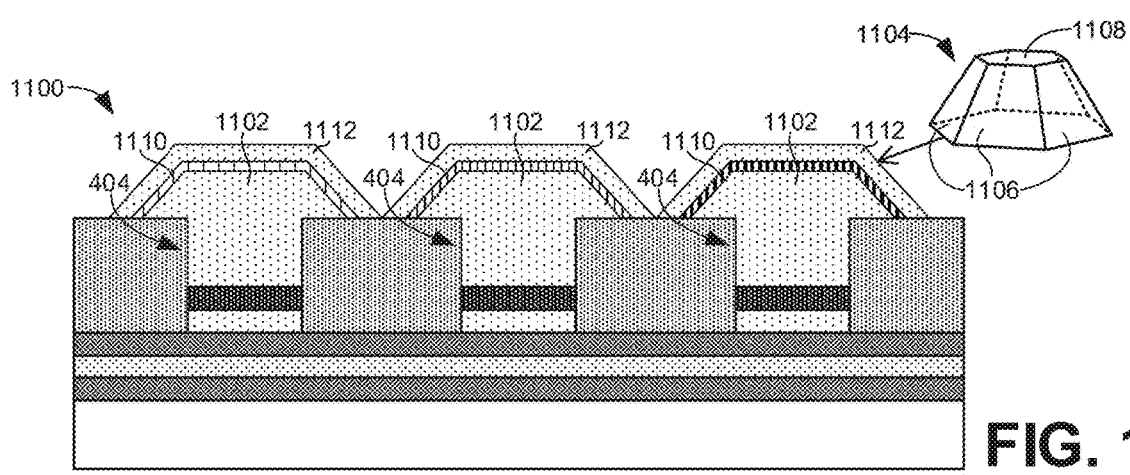
FIG. 11 illustrates another example micro-LED assembly constructed on a silicon wafer in accordance with teachings disclosed herein.

FIG. 11 represents another example micro-LED assembly 1000 at the same stage of fabrication as the micro-LED assembly 200 shown in FIG. 7. The example micro-LED assembly 1100 of FIG. 11 is substantially the same as the example micro-LED assembly 200 of FIG. 7 except for the shape of the cap above each nanorod 404. More particularly, whereas the example micro-LED assembly 200 of FIG. 7 includes pyramids 502 that are peaked or pointed, the example micro-LED assembly 1100 of FIG. 11 includes pyramids 1102 that are truncated with a planar upper surface as shown by the representative isometric diagram 1104 of FIG. 11. In other words, whereas the six semipolar {1$\bar{1}$01} planes 506 (corresponding to r-planes) converge to a point in the example of FIGS. 2-7, the six semipolar planes 1106 in FIG. 11 (also corresponding to r-planes) align the perimeter of a top c-plane 1108. The different shape in the truncated pyramids 1102 in FIG. 11, relative to the pointed pyramids 502 in FIG. 7, results in a correspondingly different shape in the active layer 1110, and the p-cladding layer 1112. The different shape in the caps of the nanorods 404 shown in FIG. 11, relative to the caps shown in FIG. 7, may be achieved by altering the parameters for the MOCVD process to epitaxially grow the pyramids 1102.

The different features in the example micro-LED assemblies 200, 900, 1000, 1100 of FIGS, 7, 9, 10, and 11 may be combined in any suitable combination. For example, the second transition layer 902 formed within the apertures 212, as shown in FIG. 9, may be used in combination with nanorods 404 that do not include the polarization inversion layer 302 as shown in FIG. 10 and/or in combination with the truncated pyramids 1102 shown in FIG. 11. Similarly, implementing some nanorods 404 with the polarization inversion layer 302 and omitting the inversion layer for other nanorods 404 as shown in FIG. 10 may be used in combination with the truncated pyramids 1102 shown in FIG. 11.

Figure 12:
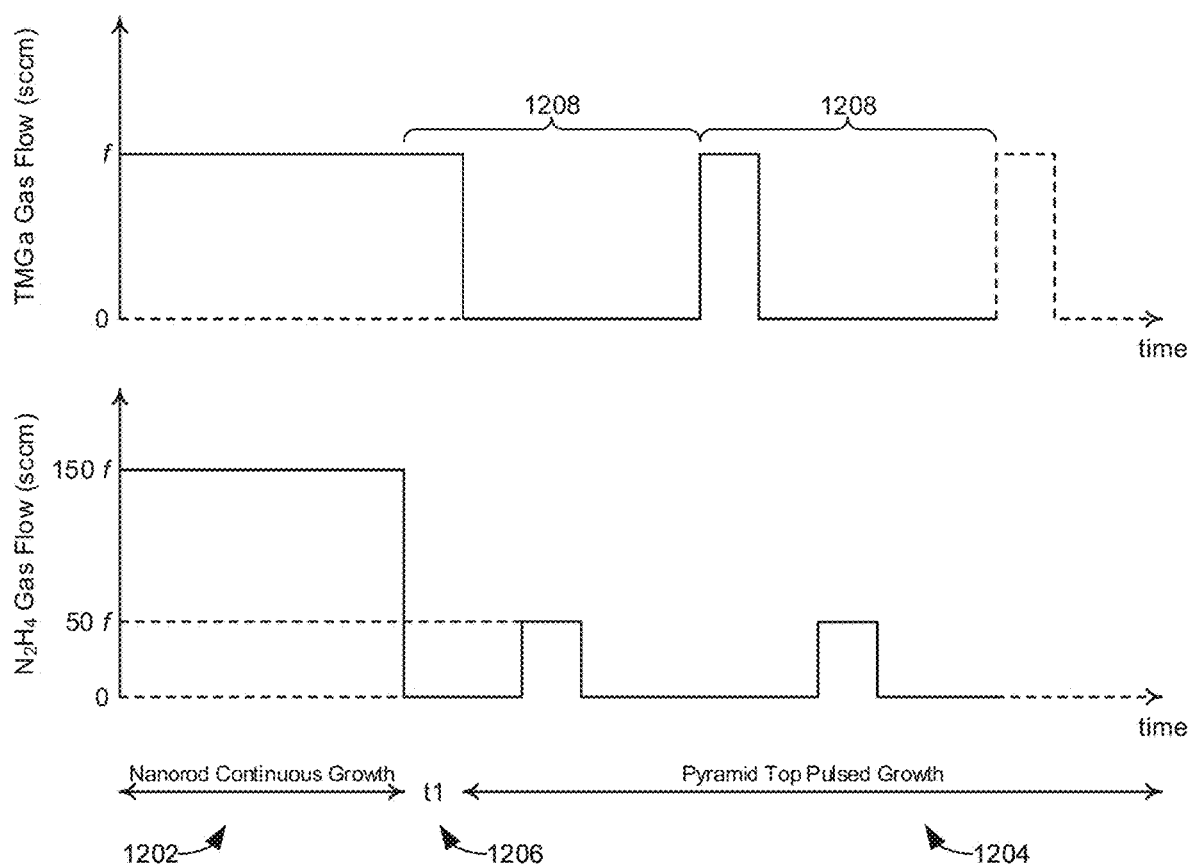
FIG. 12 illustrates example precursor gas flow curves for epitaxially growing the GaN nanorods and pyramids associated with the micro-LEDs of the example micro-LED assemblies of FIGS. 7, 9, 10, and/or 11.

FIG. 12 illustrates example precursor gas flow curves for epitaxially growing the GaN nanorods 404 (within the apertures 212 of the mask 210) during a first continuous MOCVD phase 1202 and epitaxially growing the GaN pyramids 502 (above the mask 210) during a second pulsed MOCVD phase 1204. In this example, a first precursor gas (represented by the top gas flow curve) corresponds to trimethylgallium (TMGa) and a second precursor gas (represented by the bottom gas flow curve) corresponds to hydrazine ($N_2H_4$). In some examples, the second precursor gas corresponds to ammonia ($NH_3$).

As shown in the illustrated examples, the nanorods 404 are formed during a selective growth process (e.g., the continuous MOCVD phase 1202) in which the gas flows are maintained at a constant flowrate. This initial selective growth process (e.g., the continuous MOCVD phase 1202) is terminated at a transition time (t1) 1206, whereupon the pulsed MOCVD phase 1204 begins. In some examples, the pulsed growth phase 1204 includes a number of pulsed sequences 1208. In the illustrated example, the pulsed sequences 1208 correspond to successively repeating loops. In other examples, different sequences in the series may differ from one another.

As a specific example, during the continuous phase 1202, the GaN nanorods 404 may be formed in any suitable MOCVD reactor with the first precursor gas (e.g., TMGa) at a constant flow rate of about 10 standard cubic centimeters per minute (sccm), and the second precursor gas (e.g., $NH_3$ or $N_2H_4$) at a constant flow rate of about 1500 sccm. That is, during this selective growth phase, both group III and group V precursor gases (e.g., group III includes gallium (Ga) and group V includes nitrogen (N)) are provided to the substrate together in a continuous, non-pulsed growth mode. Further, the group V precursor gas (e.g., TMGa) and the group III precursor gas (e.g. $NH_3$ or $N_2H_4$) can be introduced simultaneously with the group V/group III ratio being maintained in the range of about 100 to about 500. More particularly, in the illustrated example of FIG. 12, the group V/group III ratio is maintained at about 150. Other reactor conditions for the selective growth can include, for example, an initial reaction temperature of about 1010° C. to about 1060° C., a reactor pressure of about 100 Torr, and a hydrogen/nitrogen carrier gas mixture having a laminar flow of about 3000-5000 sccm.

During the pulsed growth phase 1204, the GaN pyramid 502, 1102 is grown by alternately introducing the first precursor gas (e.g., TMGa) and the second precursor gas (e.g. $NH_3$ or $N_2H_4$) into the growth reactor in a specified sequence, such as the sequence 1208 of FIG. 12. The duration at which each of the first and second precursor gas are provided to the reactor during each sequence 1208 can affect the growth of the pyramid and, therefore the resulting geometry or shape of the pyramid. As a specific example, during the first sequence 1208, the first precursor gas (e.g., TMGa) may be introduced at a flow rate of about 10 sccm for a period of about 20 seconds followed by a 10 second carrier-gas purge (e.g., a mixture of hydrogen and nitrogen) during which no precursor gases are introduced. Following the 10 second carrier-gas purge, the second precursor gas (e.g. $NH_3$ or $N_2H_4$) may be introduced at a flow rate of about 1500 sccm for a period of about 30 seconds followed by another 10 second carrier-gas purge with no precursor gases involved. In other examples, the time periods when the first and second precursor gases are introduced may be longer or shorter than in the above example. For instance, in some examples, the time periods for the delivery of the precursor gases ranges from about 15 seconds to about 40 seconds. Further, the duration of the carrier-gas purge may range from about 5 seconds to about 15 seconds. In some examples, the particular parameters for the first sequence 1208 is repeated one or more times until the GaN pyramid grows to a desired height and/or shape. In some such examples, the group V precursor gas (e.g., TMGa) and the group III precursor gas (e.g. $NH_3$ or $N_2H_4$) can have an effective group V/group III ratio that ranges from about 60 to about 300. In some examples, the temperature, reactor pressure, and carrier gas flow for the pulsed growth phase 904 can remain at the same settings as for the selective growth.

Figure 13:
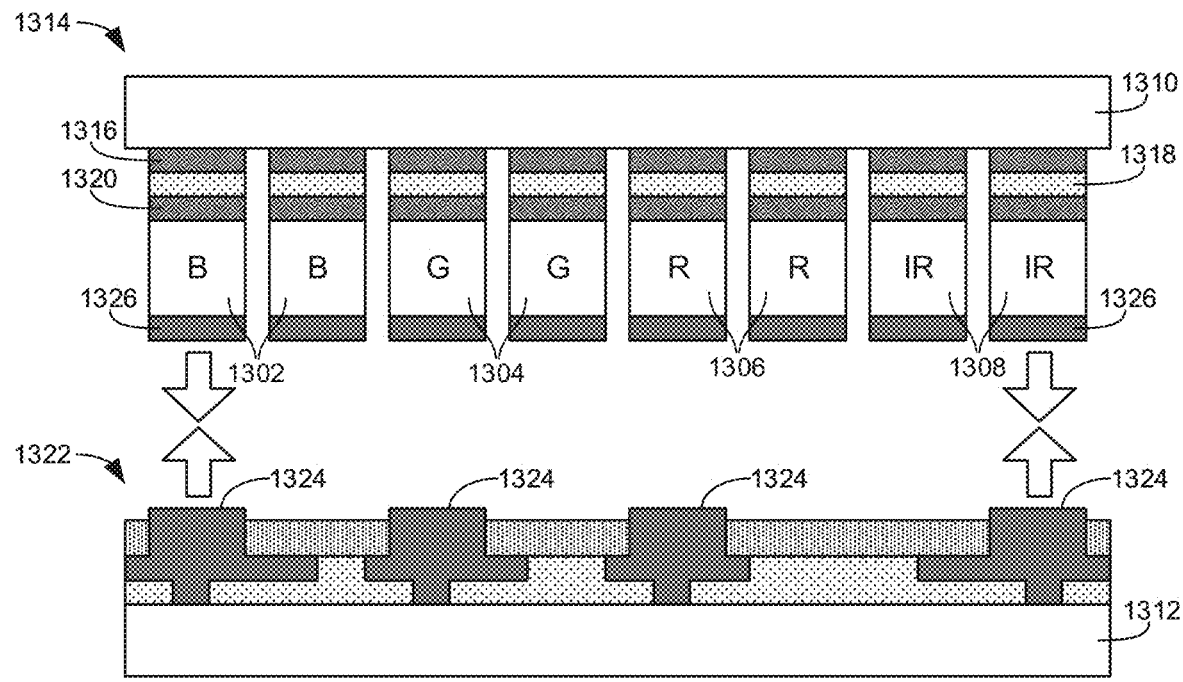
FIGS. 13 and 14 illustrate stages in an example process to transfer the micro-LEDs of the example micro-LED assemblies of FIGS. 7, 9, 10, and/or 11 to a display backplane assembly.
Figure 14:
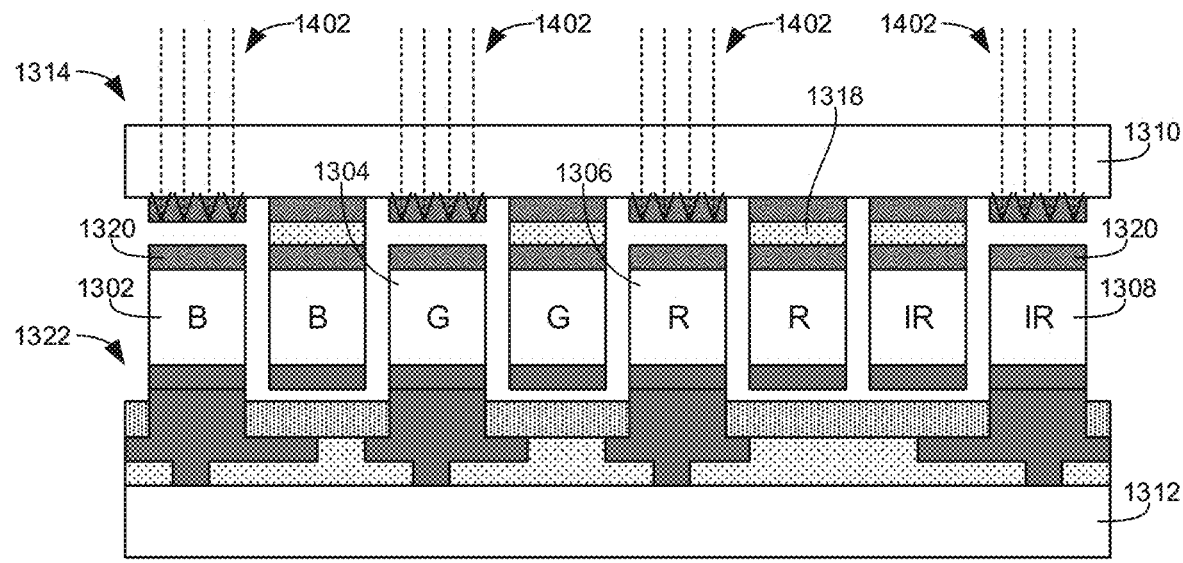

FIGS. 13 and 14 illustrate stages in an example process to transfer an array of micro-LEDs 1302, 1304, 1306, 1308 from a silicon substrate 1310 (e.g., a 300 mm silicon wafer) to a display backplane substrate 1312. In some examples, the display backplane substrate 1312 corresponds to the underlying substrate 106 of FIG. 1. The illustrated example of FIG. 13 shows two blue micro-LEDs 1302, two green micro-LEDs 1304, two red micro-LEDs 1306, and two infrared micro-LEDs 1308 formed on a silicon substrate 1310 (e.g., a 300 mm silicon wafer) as described above in connection with FIGS. 2-12. That is, FIG. 13 shows a micro-LED assembly 1314 that may correspond to any one of the micro-LED assemblies 200, 900, 1000, 1100 of FIGS. 7, 9, 10, and/or 11. However, unlike the micro-LED assemblies 200, 900, 1000, 1100 of FIGS. 7, 9, 10, and 11, the example micro-LED assembly 1314 of FIG. 13 has been inverted or flipped over to facilitate the transfer of the micro-LEDs to the upward facing display backplane assembly 1322. For purposes of explanation, the micro-LEDs 1302, 1304, 1306, 1308 are generically represented as blocks but may correspond to the shape and/or structure of the micro-LEDs shown in any of FIGS. 7, 9, 10, and/or 11. As shown in the illustrated example, the micro-LED assembly 1314 includes a first transition layer 1316, a release layer 1318, and a second transition layer 1320 between the silicon substrate 1310 and the micro-LEDs 1302, 1304, 1306, 1308. In some examples, the first transition layer 1316, the release layer 1318, and the second transition layer 1320 correspond to the first transition layer 204, the release layer 206, and the second transition layer 208 described above in connection with FIGS. 2-11.

As represented in FIG. 13, the micro-LED assembly 1314 is inverted to be pressed against the display backplane assembly 1322 to selectively bond ones of the micro-LEDs 1302, 1304, 1306, 1308 to corresponding metal bumps 1324 (e.g., copper bumps) on the display backplane assembly 1322. In some examples, the bonding is accomplished using a thermocompression bonding (TCB) process. In some examples, a metallization layer 1326 is added to the micro-LEDs 1302, 1304, 1306, 1308 before the TCB process to facilitate electrical contact between the micro-LEDs 1302, 1304, 1306, 1308 and the metal bumps 1324. In this example, only one of each of the blue micro-LEDs 1302, the green micro-LEDs 1304, the red micro-LEDs 1306, and the infrared micro-LED 1308 are bonded to corresponding bumps 1324. In other examples, fewer, more, and/or different combinations of the micro-LEDs 1302, 1304, 1306, 1308 may additionally or alternatively be bonded to the display backplane assembly 1322.

Once the micro-LEDs 1302, 1304, 1306, 1308 have been bonded to the display backplane assembly 1322, the bonded micro-LEDs are separated from the silicon substrate 1310 through an ablation process. More particularly, as represented in FIG. 14, the micro-LEDs 1302, 1304, 1306, 1308 are selective released using backside (e.g., silicon side) irradiation with an infrared laser beam 1402 that ablates the release layer 1318. In some examples, the infrared laser beam 1402 has a wavelength of at least 1300 nm. As shown in the illustrated example, with the release layer 1318 removed through the ablation process, the micro-LED assembly 1314 that includes the silicon substrate 1310 may be removed with select ones of the micro-LEDs 1302, 1304, 1306, 1308 transferred to the display backplane assembly 1322. In some examples, subsequent processing may include the removal of the second transition layer 1320 that remains on the surface of the transferred micro-LEDs 1302, 1304, 1306, 1308.

In some examples, the display backplane assembly 1322 includes circuitry communicatively coupled to the metal bumps 1324 to activate and/or control the operation of the micro-LEDs transferred to the display backplane assembly 1322. As a result, the display backplane assembly 1322 (with the transferred micro-LEDs) may be incorporated into any suitable display device such as the electronic device 100 of FIG. 1.

Figure 15:
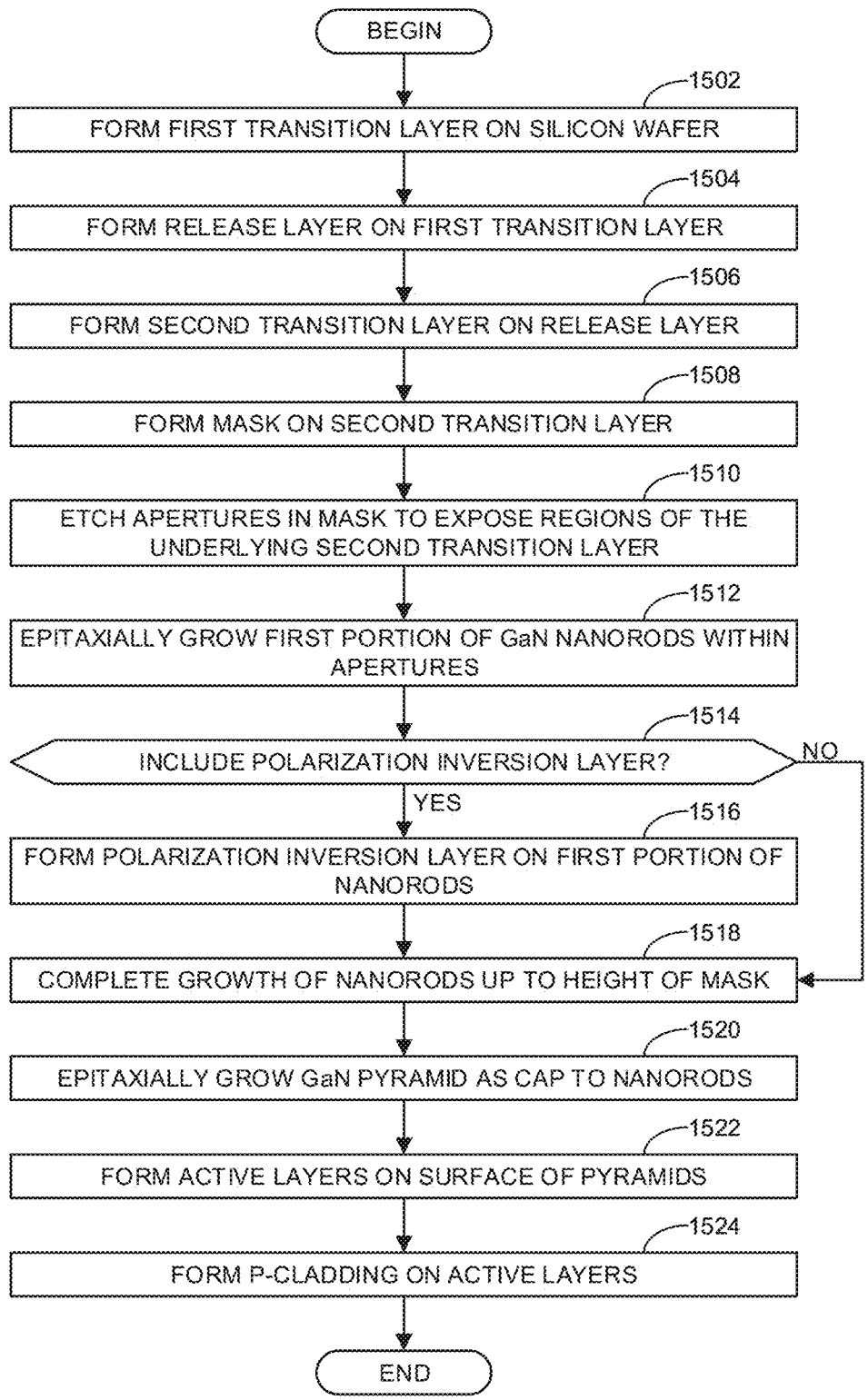
FIG. 15 is a flowchart representative of an example method to manufacture the example micro-LED assemblies of any one of FIGS. 7, 9, 10, 11, and/or 13.

FIG. 15 is a flowchart representative of an example method of manufacturing the example micro-LED assemblies 200, 900, 1000, 1100, 1314 of FIGS. 7, 9, 10, 11, and/or 13. For purposes of explanation, the flowchart of FIG. 15 will be described with reference to FIGS. 2-7. The example process begins at block 1502 where the first transition layer 204 is formed on the silicon substrate 202 (e.g., a 300 mm silicon wafer). At block 1504, the release layer 206 is formed on the first transition layer 204. At block 1506, the second transition layer 208 is formed on the release layer 206. At block 1508, the mask 210 is formed on the second transition layer 204. At block 1510, the apertures 212 are etched in the mask 210 to expose regions of the underlying second transition layer 208. In some examples, block 1506 is implemented after block 1510. That is, in some examples, the mask 210 is formed on the release layer 206 with the apertures formed in the mask 210 to expose regions of the release layer 206. Thereafter, the second transition layer 208 is formed on the exposed regions of the release layer 206.

At block 1512, the first portion 214 of the GaN nanorods 404 are epitaxially grown within the apertures. In some examples, the second transition layer 208 serves as the nucleation layer to facilitate this growth. In some examples, block 1506 may be omitted entirely. In such examples, the release layer 206 serves as the nucleation layer for the epitaxially growth of the GaN nanorods 404. At block 1514, a determination is made as to whether to include a polarization inversion layer 302. In some examples, certain nanorods 404 include a polarization inversion layer 302 while other nanorods 404 do not. For the nanorods 404 that are to include a polarization inversion layer 302, the process advances to block 1516 where the polarization inversion layer is formed on the first portion 214 of the nanorods. Thereafter, at block 1518, the growth of the nanorods 404 is completed up to height of mask 210. For nanorods 404 that are not to include the polarization inversion layer (determined at block 1514), the process advances directly to block 1518 to complete the growth of the nanorods 404. In some examples, the epitaxially growth of the nanorods 404 (at blocks 1512 and 1518) involves a continuous MOCVD process.

At block 1520, the GaN pyramid 502 is epitaxially grown as a cap to the nanorods 404. In some examples, the growth of the pyramid 502 involves a pulsed MOCVD process. In some examples, the parameters of the MOCVD process can be adjusted to achieve different geometries. For instance, in some examples, the pyramid 502 is a pointed pyramid. In other examples, the pyramid is a truncated pyramid (e.g., the pyramids 1102 of FIG. 11). At block 1522, the active layer 602 is formed on the surface of the pyramids 502. As described above, the active layers 602 include indium (e.g., as indium gallium nitride (InGaN) and/or as indium nitride (InN)) that forms one or more quantum wells. In some examples, the amount of indium controls the wavelength of light the resulting micro-LED produces with higher concentrations of indium corresponding to longer wavelengths of light. Accordingly, in some examples, different active layers 602 associated with different micro-LEDs are controlled to have different amounts of indium. At block 1524, the p-cladding 708 is formed on the active layers 602. Thereafter, the example process of FIG. 15 ends. However, further processing may occur including, for example, the transfer of the resulting micro-LEDs to a display backplane for incorporation into an electronic display device.

Although the example method of FIG. 15 is described with reference to the flowchart shown in FIG. 15, many other methods of manufacturing the example micro-LED assemblies 200, 900, 1000, 1100, 1314 of FIGS. 7, 9, 10, 11, and/or 13 may alternatively be used. For example, the order of execution of the blocks in FIG. 15 may be changed, and/or some of the blocks described may be changed, eliminated, or combined. Similarly, additional operations may be included in the manufacturing process before, in between, or after the blocks shown in FIG. 15.

From the foregoing, it will be appreciated that example methods, apparatus and articles of manufacture have been disclosed that enable blue, green, and red micro-LEDs to be manufactured on a single silicon wafer in a cost effective manner. Further, the micro-LEDs manufactured in accordance with teachings disclosed herein provide higher color purity than other known micro-LEDs while also being more efficient (e.g., consuming less power). Furthermore, in some examples, infrared light emitting micro-LEDs may be manufactured in accordance with teachings disclosed herein. As such, teachings disclosed herein enable full color displays (e.g., with red, green, and blue LEDs) that also include infrared LEDs that may be used for touch sensing with all of the LEDS (e.g., red, green, blue, and infrared) manufactured on a single silicon substrate (e.g., a 300 mm silicon wafer).

Example micro-LED structures for full color displays and methods of manufacturing the same are disclosed herein. Further examples and combinations thereof include the following:

Example 1 includes an apparatus for a micro-LED display, the apparatus comprising a first portion of a nanorod, a second portion of the nanorod, the first and second portions including gallium and nitrogen, a polarization inversion layer between the first portion and the second portion, and a cap at an end of the nanorod, the cap including a core and an active layer, the core including gallium and nitrogen, the active layer including indium.

Example 2 includes the apparatus of example 1, wherein the indium in the active layer has a concentration of at least 45%.

Example 3 includes the apparatus of any one of examples 1 or 2, wherein an amount of the indium in the active layer enables emission of red light with an internal quantum efficiency of at least 15%.

Example 4 includes the apparatus of example 3, wherein an emission spectrum of the red light is associated with a full width half maximum value of less than 60 nm.

Example 5 includes the apparatus of any one of examples 1-4, wherein the nanorod is a first nanorod, the cap is a first cap, and the active layer is a first active layer, the first nanorod, the first cap, and the first active layer associated with a first micro-LED, the apparatus further including a second nanorod associated with a second micro-LED, and a second cap including a second active layer, the second cap and the second active layer associated with a second micro-LED, the first micro-LED to emit at least one of red light or infrared light, the second micro-LED to emit at least one of blue light or green light.

Example 6 includes the apparatus of example 5, wherein the first and second micro-LEDs are fabricated on a single silicon wafer.

Example 7 includes the apparatus of any one of examples 5 or 6, wherein the polarization inversion layer is a first polarization inversion layer, the second nanorod including a second polarization inversion layer between different portions of the second nanorod.

Example 8 includes the apparatus of any one of examples 5 or 6, wherein the second nanorod does not include a polarization inversion layer.

Example 9 includes the apparatus of any one of examples 1-8, wherein the polarization inversion layer includes at least one of aluminum, oxygen, magnesium, silicon, or carbon.

Example 10 includes the apparatus of any one of examples 1-9, wherein the cap is a first cap, and further including a plurality of caps including the first cap, the plurality of caps corresponding to a plurality of micro-LEDs, the plurality of micro-LEDs including a red micro-LED, a green micro-LED, a blue micro-LED, and at least one of an infrared micro-LED or a near-infrared micro-LED.

Example 11 includes the apparatus of example 10, wherein the at least one of the infrared micro-LED or the near-infrared micro-LED is to be used as a sensor.

Example 12 includes the apparatus of any one of examples 1-11, wherein the cap has a shape corresponding to a pyramid.

Example 13 includes the apparatus of example 12, wherein the shape corresponds to a hexagonal pyramid.

Example 14 includes the apparatus of any one of examples 12 or 13, wherein the shape corresponds to a truncated pyramid.

Example 15 includes the apparatus of any one of examples 1-14, further including a release layer positioned between the nanorod and a silicon substrate, and a transition layer positioned between the release layer and the nanorod.

Example 16 includes the apparatus of example 15, further including a mask including a dielectric material, the nanorod defined by an aperture extending through the mask, the transition layer positioned between the mask and the release layer.

Example 17 includes the apparatus of example 15, further including a mask including a dielectric material, the nanorod defined by an aperture extending through the mask, the transition layer positioned within the aperture between the nanorod and the release layer.

Example 18 includes the apparatus of any one of examples 15-17, wherein the release layer includes at least one of titanium, hafnium, niobium, tantalum, zirconium, nitrogen, or molybdenum and the transition layer includes at least one of aluminum or nitrogen.

Example 19 includes the apparatus of any one of examples 15-18, wherein the transition layer is a first transition layer, and further including a second transition layer, the release layer positioned between the first and second transition layers.

Example 20 includes an apparatus comprising a nanorod including gallium and nitrogen, a pyramid at an end of the nanorod, the pyramid including gallium and nitrogen, a p-cladding layer including gallium and nitrogen, and an active layer between the pyramid and the p-cladding layer, the active layer including greater than 50% indium.

Example 21 includes the apparatus of example 20, wherein the active layer includes a quantum well layer sandwiched between quantum barrier layers, the quantum barrier layers including indium, gallium and nitrogen, the quantum well layer including indium and nitrogen, the quantum well layer not including gallium.

Example 22 includes the apparatus of any one of examples 20 or 21, wherein an amount of the indium in the active layer enables emission of at least one of red light or infrared light at an internal quantum efficiency of at least 15%.

Example 23 includes the apparatus of any one of examples 20-22, wherein the nanorod is a first nanorod, the pyramid is a first pyramid, and the active layer is a first active layer, the apparatus further including a first micro-LED including the first nanorod, the first pyramid, and the first active layer associated with a first micro-LED a second micro-LED including a second nanorod, a second pyramid, and a second active layer associated with a first micro-LED, the second active layer including less indium than the first active layer, the first micro-LED corresponding to one of a red micro-LED or an infrared micro-LED, the second micro-LED corresponds to one of a blue micro-LED or a green micro-LED.

Example 24 includes the apparatus of example 23, wherein the first and second micro-LEDs are fabricated on a single silicon wafer.

Example 25 includes the apparatus of example 24, wherein the first micro-LED includes a first polarization inversion layer within the first nanorod, the second micro-LED including a second polarization inversion layer within the second nanorod.

Example 26 includes the apparatus of example 24, wherein the first nanorod includes a polarization inversion layer, the second nanorod not including a polarization inversion layer.

Example 27 includes the apparatus of any one of examples 20-26, wherein the pyramid has a hexagonal shape.

Example 28 includes the apparatus of any one of examples 20-27, wherein the pyramid is peaked.

Example 29 includes the apparatus of any one of examples 20-27, wherein the pyramid is truncated.

Example 30 includes the apparatus of any one of examples 20-29, further including a mask, a shape of the nanorod defined by an aperture extending through the mask, a release layer positioned between the nanorod and a silicon substrate, the release layer positioned between the mask and the silicon substrate, and a transition layer positioned between the release layer and the nanorod.

Example 31 includes the apparatus of example 30, wherein the transition layer is positioned between the mask and the release layer.

Example 32 includes the apparatus of example 30, wherein the transition layer is positioned within the aperture between the nanorod and the release layer.

Example 33 includes the apparatus of any one of examples 30-32, wherein the transition layer is a first transition layer, and further including a second transition layer, the release layer positioned between the first and second transition layers.

Example 34 includes an apparatus for a micro-LED display, the apparatus comprising a first portion of a nanorod, a second portion of the nanorod, the first and second portions including gallium and nitrogen, means for inverting a polarity of the second portion of the nanorod relative to the first portion of the nanorod, a pyramid at an end of the nanorod, the pyramid including gallium and nitrogen, and an active layer, the active layer including indium to enable emission of red light with an internal quantum efficiency of at least 15%.

Example 35 includes the apparatus of example 34, wherein the indium in the active layer has a concentration of at least 55%.

Example 36 includes the apparatus of any one of examples 34 or 35, wherein an emission spectrum of the red light is associated with a full width half maximum value of less than 70 nm.

Example 37 includes the apparatus of any one of examples 34-36, wherein the nanorod is a first nanorod, the pyramid is a first pyramid, and the active layer is a first active layer, the apparatus further including a red micro-LED, the red micro-LED including the first nanorod, the first pyramid, and the first active layer, and a second micro-LED, the second micro-LED including a second nanorod, a second pyramid, and a second active layer, the second micro-LED to emit a different wavelength of light than the red micro-LED, the red micro-LED and the second micro-LED fabricated on a single silicon wafer.

Example 38 includes the apparatus of example 37, wherein the second micro-LED emits infrared light.

Example 39 includes the apparatus of example 38, wherein the second micro-LED is to be used as a sensor.

Example 40 includes the apparatus of example 37, wherein the second micro-LED emits at least one of blue light or green light.

Example 41 includes the apparatus of any one of examples 37-40, wherein both the first and second nanorods include the means for inverting the polarity.

Example 42 includes the apparatus of any one of examples 37-40, wherein the first nanorod includes the means for inverting the polarity, the second nanorod not including the means for inverting the polarity.

Example 43 includes the apparatus of any one of examples 34-42, further including a mask, a shape of the nanorod defined by an aperture extending through the mask, a release layer positioned between the nanorod and a silicon substrate, the release layer positioned between the mask and the silicon substrate, and a transition layer positioned between the release layer and the nanorod.

Example 44 includes the apparatus of example 43, wherein the transition layer is positioned between the mask and the release layer.

Example 45 includes the apparatus of example 43, wherein the transition layer is positioned within the aperture between the nanorod and the release layer.

Example 46 includes the apparatus of any one of examples 43-45, wherein the transition layer is a first transition layer, and further including a second transition layer, the release layer positioned between the first and second transition layers.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus for a micro-LED display, the apparatus comprising:
   a first portion of a nanorod;
   a second portion of the nanorod, the first and second portions including gallium and nitrogen;
   a polarization inversion layer between the first portion and the second portion; and
   a cap at an end of the nanorod, the cap including a core and an active layer, the core including gallium and nitrogen, the active layer including indium.

2. The apparatus of claim 1, wherein the indium in the active layer has a concentration of at least 45%.

3. The apparatus of claim 1, wherein the active layer enables emission of red light, an emission spectrum of the red light is associated with a full width half maximum value of less than 60 nm.

4. The apparatus of claim 1, wherein the nanorod is a first nanorod, the cap is a first cap, and the active layer is a first active layer, the first nanorod, the first cap, and the first active layer associated with a first micro-LED, the apparatus further including:
a second nanorod associated with a second micro-LED; and
a second cap including a second active layer, the second cap and the second active layer associated with a second micro-LED, the first micro-LED to emit at least one of red light or infrared light, the second micro-LED to emit at least one of blue light or green light.

5. The apparatus of claim 4, wherein the first and second micro-LEDs are fabricated on a single silicon wafer.

6. The apparatus of claim 4, wherein the polarization inversion layer is a first polarization inversion layer, the second nanorod including a second polarization inversion layer between different portions of the second nanorod.

7. The apparatus of claim 4, wherein the second nanorod does not include a polarization inversion layer.

8. The apparatus of claim 1, wherein the polarization inversion layer includes at least one of aluminum, oxygen, magnesium, silicon, or carbon.

9. The apparatus of claim 1, wherein the cap is a first cap, and further including a plurality of caps including the first cap, the plurality of caps corresponding to a plurality of micro-LEDs, the plurality of micro-LEDs including a red micro-LED, a green micro-LED, a blue micro-LED, and at least one of an infrared micro-LED or a near-infrared micro-LED.

10. The apparatus of claim 9, wherein the at least one of the infrared micro-LED or the near-infrared micro-LED is to be used as a sensor.

11. The apparatus of claim 1, further including:
a release layer positioned between the nanorod and a silicon substrate; and
a transition layer positioned between the release layer and the nanorod.

12. The apparatus of claim 11, further including a mask including a dielectric material, the nanorod defined by an aperture extending through the mask, the transition layer positioned between the mask and the release layer.

13. The apparatus of claim 11, further including a mask including a dielectric material, the nanorod defined by an aperture extending through the mask, the transition layer positioned within the aperture between the nanorod and the release layer.

14. The apparatus of claim 11, wherein the release layer includes at least one of titanium, hafnium, niobium, tantalum, zirconium, nitrogen, or molybdenum and the transition layer includes at least one of aluminum or nitrogen.

15. The apparatus of claim 11, wherein the transition layer is a first transition layer, and further including a second transition layer, the release layer positioned between the first and second transition layers.

16. An apparatus comprising:
a nanorod including gallium and nitrogen;
a pyramid at an end of the nanorod, the pyramid including gallium and nitrogen, the pyramid having a truncated shape;
a p-cladding layer including gallium and nitrogen; and
an active layer between the pyramid and the p-cladding layer, the active layer including greater than 50% indium.

17. The apparatus of claim 16, wherein the active layer includes a quantum well layer sandwiched between quantum barrier layers, the quantum barrier layers including indium, gallium and nitrogen, the quantum well layer including indium and nitrogen, the quantum well layer not including gallium.

18. The apparatus of claim 16, wherein the nanorod is a first nanorod, the pyramid is a first pyramid, and the active layer is a first active layer, the apparatus further including:
a first micro-LED including the first nanorod, the first pyramid, and the first active layer associated with a first micro-LED
a second micro-LED including a second nanorod, a second pyramid, and a second active layer associated with a first micro-LED, the second active layer including less indium than the first active layer, the first micro-LED corresponding to one of a red micro-LED or an infrared micro-LED, the second micro-LED corresponds to one of a blue micro-LED or a green micro-LED.

19. The apparatus of claim 18, wherein the first and second micro-LEDs are fabricated on a single silicon wafer.

20. The apparatus of claim 19, wherein the first micro-LED includes a first polarization inversion layer within the first nanorod, the second micro-LED including a second polarization inversion layer within the second nanorod.

21. The apparatus of claim 16, wherein the pyramid has a hexagonal shape.

22. The apparatus of claim 16, further including:
a mask, a shape of the nanorod defined by an aperture extending through the mask;
a release layer positioned between the nanorod and a silicon substrate, the release layer positioned between the mask and the silicon substrate; and
a transition layer positioned between the release layer and the nanorod.

23. The apparatus of claim 22, wherein the transition layer is positioned between the mask and the release layer.

24. The apparatus of claim 22, wherein the transition layer is a first transition layer, and further including a second transition layer, the release layer positioned between the first and second transition layers.

25. An apparatus for a micro-LED display, the apparatus comprising:
a first portion of a nanorod;
a second portion of the nanorod, the first and second portions including gallium and nitrogen;
means for inverting a polarity of the second portion of the nanorod relative to the first portion of the nanorod;
a truncated pyramid at an end of the nanorod, the pyramid including gallium and nitrogen; and
an active layer, the active layer including indium to enable emission of red light with an internal quantum efficiency of at least 15%.

26. The apparatus of claim 25, wherein the nanorod is a first nanorod, the pyramid is a first pyramid, and the active layer is a first active layer, the apparatus further including:
a red micro-LED, the red micro-LED including the first nanorod, the first pyramid, and the first active layer; and
a second micro-LED, the second micro-LED including a second nanorod, a second pyramid, and a second active layer, the second micro-LED to emit a different wavelength of light than the red micro-LED, the red micro-LED and the second micro-LED fabricated on a single silicon wafer.

27. The apparatus of claim 26, wherein both the first and second nanorods include the means for inverting the polarity.

28. The apparatus of claim 26, wherein the first nanorod includes the means for inverting the polarity, the second nanorod not including the means for inverting the polarity.

29. The apparatus of claim 25, wherein the indium in the active layer has a concentration of at least 55%.

30. The apparatus of claim 25, wherein an emission spectrum of the red light is associated with a full width half maximum value of less than 70 nm.

* * * * *